(12) United States Patent
Nguyen et al.

(10) Patent No.: US 9,416,450 B2
(45) Date of Patent: Aug. 16, 2016

(54) SHOWERHEAD DESIGNS OF A HOT WIRE CHEMICAL VAPOR DEPOSITION (HWCVD) CHAMBER

(71) Applicant: APPLIED MATERIALS, INC., Santa Clara, CA (US)

(72) Inventors: Hanh D. Nguyen, San Jose, CA (US); Joe Griffith Cruz, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 216 days.

(21) Appl. No.: 14/052,321

(22) Filed: Oct. 11, 2013

(65) Prior Publication Data

US 2014/0113084 A1    Apr. 24, 2014

Related U.S. Application Data

(60) Provisional application No. 61/718,124, filed on Oct. 24, 2012.

(51) Int. Cl.
*C23C 16/44* (2006.01)
*C23C 16/455* (2006.01)
*C23C 16/27* (2006.01)

(52) U.S. Cl.
CPC ......... *C23C 16/45565* (2013.01); *C23C 16/271* (2013.01); *C23C 16/276* (2013.01); *C23C 16/44* (2013.01)

(58) Field of Classification Search
CPC .. C23C 16/271; C23C 16/276; C23C 28/044; C23C 16/45565; C23C 16/44
USPC ............................ 118/723 HC; 156/345.37
See application file for complete search history.

(56) References Cited

U.S. PATENT DOCUMENTS 4,974,544 A * 12/1990 Ohta ................. C23C 16/4557
                                                            118/723 HC
4,977,855 A * 12/1990 Ohmi .................... C23C 16/483
                                                            118/722

(Continued)

FOREIGN PATENT DOCUMENTS

JP      2000331942 A  * 11/2000
JP      2002151693 A  *  5/2002

(Continued)

OTHER PUBLICATIONS

International Search Report and Written Opinion mailed Jan. 29, 2014 for PCT Application No. PCT/US2013/065011.

*Primary Examiner* — Rudy Zervigon
(74) *Attorney, Agent, or Firm* — Moser Taboada; Alan Taboada

(57) ABSTRACT

Embodiments of process chambers and methods for performing HWCVD processes within such process chambers and depositing a thin film from two or more source compounds on a surface of a substrate are provided. In some embodiments, the process chamber includes a showerhead assembly disposed between a metal filament assembly and a substrate processing zone. The showerhead assembly includes a showerhead body and a dual-zone face plate with a plurality of first channels and second channels therein. A first source compound is delivered through the metal filament assembly to form radicals of the first source compound and pass through the first channels into the substrate processing zone without forming any plasma. A second source compound is delivered through the showerhead body into the second channels of the dual-zone face plate without passing through the metal filament assembly and without contacting the radicals until reaching the substrate processing zone.

20 Claims, 8 Drawing Sheets

(56) References Cited

U.S. PATENT DOCUMENTS

| | | | | |
|---|---|---|---|---|
| 5,058,527 A | * | 10/1991 | Ohta | C23C 16/45565 118/715 |
| 5,112,466 A | * | 5/1992 | Ohta | H01J 37/32422 118/723 HC |
| 5,149,375 A | * | 9/1992 | Matsuyama | C23C 16/509 118/719 |
| 5,160,544 A | * | 11/1992 | Garg | C23C 16/271 118/724 |
| 5,336,326 A | * | 8/1994 | Karner | C23C 16/503 118/666 |
| 5,350,480 A | * | 9/1994 | Gray | H01L 21/02071 134/31 |
| 5,378,285 A | * | 1/1995 | Mitani | C23C 16/513 117/929 |
| 5,651,825 A | * | 7/1997 | Nakahigashi | H01J 37/32192 118/723 ME |
| 5,879,450 A | * | 3/1999 | Lee | C30B 25/02 117/108 |
| 6,325,857 B1 | * | 12/2001 | Miyoshi | C23C 16/345 118/50.1 |
| 6,375,756 B1 | * | 4/2002 | Ishibashi | C23C 16/4405 134/1.3 |
| 6,592,771 B1 | * | 7/2003 | Yamanaka | H01L 21/3065 134/1.1 |
| 6,593,548 B2 | * | 7/2003 | Matsumura | C23C 16/24 118/725 |
| 6,656,540 B2 | * | 12/2003 | Sakamoto | C23C 16/08 118/723 ER |
| 6,709,512 B2 | * | 3/2004 | Yamoto | C23C 16/24 117/101 |
| 6,886,491 B2 | | 5/2005 | Kim et al. | |
| 6,942,892 B1 | * | 9/2005 | Ishibashi | C23C 16/44 118/723 HC |
| 7,211,152 B2 | * | 5/2007 | Ishibashi | C23C 16/4401 118/50.1 |
| 7,815,813 B2 | * | 10/2010 | Takao | H01J 37/3244 156/345.25 |
| 7,942,968 B2 | * | 5/2011 | Kang | C23C 16/44 118/715 |
| 8,006,639 B2 | * | 8/2011 | Kim | C23C 16/44 118/715 |
| 8,021,564 B2 | * | 9/2011 | Sakuragi | G03F 7/42 216/16 |
| 8,052,795 B2 | * | 11/2011 | Kang | C23C 16/44 118/715 |
| 8,703,586 B2 | * | 4/2014 | Ito | C23C 16/5096 118/723 E |
| 9,157,152 B2 | * | 10/2015 | Faguet | C23C 16/452 |
| 2002/0100557 A1 | * | 8/2002 | Li | H01J 37/321 156/345.48 |
| 2003/0000469 A1 | | 1/2003 | Pyo | |
| 2003/0013280 A1 | * | 1/2003 | Yamanaka | C23C 16/24 438/487 |
| 2003/0047282 A1 | * | 3/2003 | Sago | C23C 16/45565 156/345.34 |
| 2003/0176011 A1 | * | 9/2003 | Niira | C23C 16/24 438/96 |
| 2004/0134429 A1 | * | 7/2004 | Yamanaka | C23C 16/24 118/723 E |
| 2004/0149211 A1 | * | 8/2004 | Ahn | C23C 16/45565 118/715 |
| 2006/0254513 A1 | * | 11/2006 | Kang | C23C 16/46 118/715 |
| 2006/0254514 A1 | * | 11/2006 | Kang | C23C 16/44 118/715 |
| 2006/0257569 A1 | * | 11/2006 | Kim | C23C 16/44 427/248.1 |
| 2007/0128861 A1 | * | 6/2007 | Kim | C23C 16/24 438/680 |
| 2008/0078325 A1 | * | 4/2008 | Matsuda | C23C 16/0218 118/723 HC |
| 2009/0205570 A1 | * | 8/2009 | Kang | C23C 16/44 118/715 |
| 2009/0211707 A1 | * | 8/2009 | Chao | C23C 16/45565 156/345.34 |
| 2009/0223932 A1 | * | 9/2009 | Hida | H01J 37/32009 216/67 |
| 2010/0180819 A1 | * | 7/2010 | Hatanaka | C23C 16/30 118/719 |
| 2010/0206229 A1 | | 8/2010 | He et al. | |
| 2010/0323501 A1 | * | 12/2010 | Yamazaki | H01J 37/3244 438/479 |
| 2011/0104848 A1 | * | 5/2011 | Haas | C23C 16/24 438/57 |
| 2011/0126762 A1 | * | 6/2011 | Faguet | C23C 16/452 118/723 ER |
| 2011/0244128 A1 | * | 10/2011 | Brcka | C23C 16/44 427/248.1 |
| 2011/0256315 A1 | * | 10/2011 | Tam | C23C 16/45519 427/255.28 |
| 2011/0256729 A1 | | 10/2011 | Goodlin et al. | |
| 2011/0268880 A1 | | 11/2011 | Bour | |
| 2012/0171849 A1 | * | 7/2012 | Ito | H01L 31/18 438/478 |
| 2012/0213929 A1 | * | 8/2012 | Lee | C23C 16/44 427/255.29 |
| 2013/0160794 A1 | * | 6/2013 | Griffith Cruz | B08B 7/00 134/1.1 |
| 2013/0280860 A1 | * | 10/2013 | Tellez Oliva | C23C 16/27 438/105 |
| 2014/0113084 A1 | * | 4/2014 | Nguyen | C23C 16/44 427/585 |
| 2014/0248754 A1 | * | 9/2014 | Thadani | H01L 21/2015 438/422 |

FOREIGN PATENT DOCUMENTS

| | | |
|---|---|---|
| JP | 2006270004 A | * 10/2006 |
| JP | 2006319304 A | * 11/2006 |

\* cited by examiner

SHOWERHEAD DESIGNS OF A HOT WIRE CHEMICAL VAPOR DEPOSITION (HWCVD) CHAMBER

CROSS-REFERENCE TO RELATED APPLICATIONS

This application claims benefit of U.S. provisional patent application Ser. No. 61/718,124, filed Oct. 24, 2012, which is herein incorporated by reference.

FIELD

The invention relates to an apparatus for processing substrates, such as semiconductor substrates, and more particularly, to an apparatus for distribution of process fluids over a substrate.

BACKGROUND

Semiconductor and large area substrate processing systems generally include a process chamber having a pedestal for supporting a substrate, such as a semiconductor substrate, within the chamber proximate a processing zone. The chamber forms a vacuum enclosure defining, in part, the processing zone for performing certain processes upon the substrate. These processes may include deposition processes, such as chemical vapor deposition (CVD), to deposit a material on the substrate or an etch reaction to remove material from the substrate.

Most CVD processes require multiple process gases to be combined and form a gaseous mixture in a mixing device. The gaseous mixture may be delivered directly to the processing zone above the substrate within the CVD chamber, or may travel through one or more conduits and channels within a showerhead or gas distribution assembly near an upper portion of the CVD chamber. The showerhead or gas distribution assembly generally includes a face plate having a plurality of holes or channels such that the gaseous mixture is evenly introduced into the processing zone and uniformly distributed across the whole surface of the substrate.

Heating of the process gases as they enter into the processing zone may be necessary in controlling the reactivity of the gases and thus the property of the thin film deposited on the surface of the substrate. As the gaseous mixture is infused with thermal energy, a thermal decomposition reaction occurs between the process gases, resulting in a chemical vapor deposition reaction on the surface of the substrate. In addition, cooling of the process gases can be helpful in controlling unwanted reactions prior to release into the processing zone as the process gases refrain from reacting until they come into contact with a heated substrate.

In general, one or more fluids and process gases are heated in a thermal CVD process and/or energized into plasma in a plasma enhanced chemical vapor deposition (PECVD) process prior to being delivered above the substrate. A plasma enhanced deposition process or a very high thermal deposition temperature (e.g., more than 800° C. or higher than 1100° C.) is generally used to deposit thin film on the substrate and helps to prevent and remove impurities (e.g., amorphous carbon contaminants) in the deposited thin films. In addition, purging or cleaning with a heated gas may help remove contaminants from a processing chamber.

However, damage to existing structures on the surface of a patterned substrate arise very often when plasma or high deposition temperature is used. In addition, PECVD processes suffer from various undesirable limitations, such as: low process gas utilization (for example, about 3% to 20%); poor uniformity of the thin films deposited on the substrate surface; introduction of defects induced by plasma in the deposited films or in the substrates themselves; static deposition due to electrical grounding requirement; difficulty in scaling-up because of RF requirements; high system cost; low deposition rate (for example, approximately 0.5 nm/s for silicon); and the need to clean deposition chambers using $NF_3$ (a greenhouse gas). Thus, there is a need for an improved CVD processing tool to be used at a lower processing temperature and without the use of plasma.

Hot-wire chemical vapor deposition (HWCVD) processes are potentially suitable for silicon thin film deposition. In a HWCVD process, thermal decomposition of the process gases is facilitated by having one or more wires, or filaments supported in a CVD process chamber such that the need for forming plasma or the need to use high processing temperatures as seen in a thermal CVD process is eliminated. The wires or filaments inside a HWCVD process chamber are generally heated to a desired temperature by passing electrical current through the filaments and thus causing the generation of radicals from process gases within the HWCVD process chamber.

However, there are no robust manufacturing tools suitable to realize the full potential of a HWCVD thin film deposition process. Substrate processing by a HWCVD process was not widely used than conventional thermal or plasma enhanced CVD process. The problems are associated with reaction of some excited process gases with the metal wires and thus metal contamination from the hot wire source (metal filaments) and film impurities on the substrate surface, constant chamber cleaning, and constant breakdown and repair of the hot wire source. As uniformity of the thin films deposited on the surface of the substrate is controlled by the flows and the thermal decomposition reaction of the process gases, separation of the process gases prior to reaching the hot wires and/or prior to reaching processing zone above the surface of the substrate is needed.

Thus, the inventors believe that there is a need for a showerhead design of a HWCVD chamber which allows for excitation of a portion of the process gas mixture through hot wires in a low temperature HWCVD thin film deposition process in the absence of plasma and separated deliveries of various process gases without co-mingling of the gases prior to reaching the processing zone.

SUMMARY

Embodiments described herein relate to process chambers and methods for substrate processing in a hot-wire assisted chemical vapor deposition (HWCVD) process. In some embodiments, a process chamber for depositing a thin film layer over the surface of a substrate is provided. The process chamber may be a HWCVD process chamber with a single showerhead assembly having a face plate with two or more types of channels for separating different fluid flows. Alternatively, the HWCVD process chamber may include two showerhead assemblies, where at least one showerhead assembly includes a dual-zone face plate (e.g., with two or more types of channels) and at least one additional showerhead assembly includes a dual zone face plate or a single zone face plate (e.g., with at least one type of channels).

In some embodiments, the process chamber includes a HWCVD metal filament assembly disposed between a first source inlet and a substrate processing zone. A first source compound is delivered from the first source inlet to pass through the metal filament assembly and form radicals of the first source compound without forming any plasma in the substrate processing zone. A showerhead assembly is disposed between the metal filament assembly and the substrate processing zone. The showerhead assembly includes a face plate, such as a dual-zone face plate with two or more types of channels formed into its inner portion, and a showerhead body surrounding the face plate. The showerhead body includes a fluid conduit connected to a second source inlet and configured to deliver a second source compound through the showerhead body into the face plate without passing through the metal filament assembly and without forming any plasma.

In some embodiments, the dual-zone face plate may include a plurality of first channels and a plurality of second channels. The first channels may be formed through the upper and lower surfaces of the dual-zone face plate and configured to deliver the first source compound in radicals, fluids, and/or gases into the substrate processing zone. The second channels are formed through the lower surface of the dual-zone face plate facing the substrate processing zone and are connected to the fluid conduit of the showerhead body to deliver the second source compound into the substrate processing zone without passing the second source compound through the metal filament assembly, and without contacting the first channels or forming any plasma.

In some embodiments, the dual-zone face plate is formed by welding a top plate and a bottom plate together with a plenum therebetween. The first channels are formed to pass through the top plate, the plenum, and the bottom plate without contacting the second channels and/or the plenum between the top plate and the bottom plate. The second channels are formed from the plenum through the bottom plate. In some embodiments, the plenum is connected to the fluid conduit and the second channels for delivering the second source compound into the substrate processing zone.

In some embodiments, a process chamber for substrate processing may include a first showerhead assembly, a second showerhead assembly, and one or more metal filaments disposed between the first showerhead assembly and the second showerhead assembly. The first showerhead assembly is connected to a first source inlet and adapted to flow a first source compound uniformly through the metal filaments of the process chamber. The second showerhead assembly is connected to a second source inlet and adapted to flow a second source compound and radicals of the first source compound into a substrate processing zone. The one or more metal filaments may be disposed between the first showerhead assembly and the second showerhead assembly along the path of the flow of the first source compound inside the process chamber.

Methods for processing a substrate within a process chamber are also provided. In some embodiments, an illustrative method includes delivering a first source compound into the process chamber, delivering a current to one or more metal filaments of the process chamber, and flowing the first source compound through the one or more metal filaments to generate radicals of the first source compound, and passing the radical of the first source compound through a plurality of first channels within a face plate of a showerhead assembly. A second source compound is delivered into the showerhead assembly inside the process chamber and flowed through a plurality of second channels within the face plate of the showerhead assembly without forming any radicals or any plasma. The second source compound is reacted with the radicals of the first source compounds in a processing zone near the surface of the substrate to form a thin film over the surface of the substrate.

In some embodiments, the second source compound is flowed through the second showerhead assembly without contacting the first source compound or radicals of the first source compound until reaching the substrate processing zone. In another aspect, the first and the second source compound comprise a process gas (e.g., process fluid, precursor compound, carrier gas, inert gas, among others) for depositing the thin film layer over the surface of a substrate. In still another aspect, in forming thin film over the surface of the substrate from a mixture of two or more source compounds at a temperature lower than a thermal CVD process and without the use of plasma, only a portion of the mixture, such as the first source compound, is delivered to pass through the metal filaments of a HWCVD source to form into radicals prior to reacting with the second source compound on the surface of the substrate.

Other and further embodiments of the present invention are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Nonetheless, the teachings of the present invention can be readily understood by considering the following detailed description in conjunction with the accompanying drawings.

To facilitate understanding, identical reference numerals have been used, where possible, to designate identical elements that are common to the figures. It is also contemplated that elements disclosed in one embodiment may be beneficially utilized on other embodiments without specific recitation.

DETAILED DESCRIPTION

Figure 1:
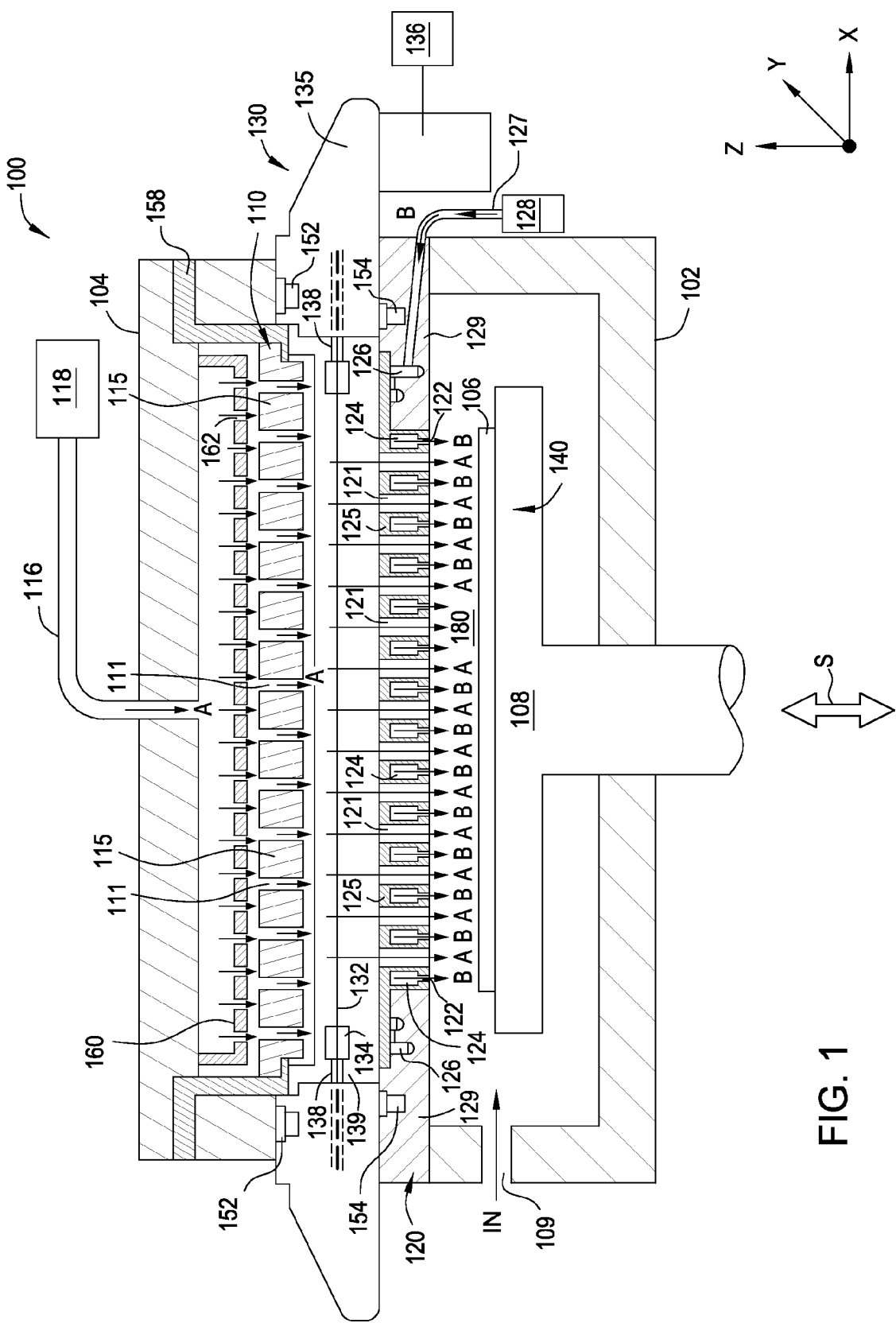
FIG. 1 is a schematic side view of a processing chamber in accordance with some embodiments of the present invention.

Embodiments and aspects described herein relate to an apparatus for delivering process fluids to a processing chamber for deposition of a thin film on a substrate or other processes. A gas distribution assembly, such as a showerhead assembly having a dual-zone face plate, is integrated with a HWCVD metal filament assembly in a HWCVD process chamber to separate multiple process gases as they pass through the HWCVD metal filaments and the gas distribution showerhead assembly. In a hot wire assisted chemical vapor deposition (HWCVD) process, one or more process gases or precursor compounds for the thin film are thermally decomposed at a high temperature within a process chamber proximate a substrate surface upon which a desired thin film material (e.g., a silicon-based material) is to be deposited. The thermal decomposition reaction is facilitated by having one or more wires, or filaments supported in the process chamber, such that substrate processing within the HWCVD process chamber can be performed in a temperature range lower than the processing temperature range for conventional thermal CVD or PECVD process chambers. The wires or filaments inside the process chamber are generally heated to a desired temperature by passing electrical current through the filaments and thus causing the generation of radicals within the HWCVD process chamber.

A substrate processing system that integrates a HWCVD filament source with a showerhead design and a temperature control aspect is provided to enable substrate deposition at a temperature lower than a thermal CVD process without the need of a plasma and separate the delivery and excitation of different process gases without co-mingling of different types of process gases. A method for depositing a thin film from two or more source compounds and improving the quality of the deposited thin film on a surface of a substrate 106 using the hot-wire assisted process chamber are also described.

It is contemplated to excite a portion of multiple source compounds (e.g., precursor compounds, process gases, carrier gases, inert gases, process fluids, etc.), or a portion of a fluid mixture required for the deposition of the thin film, using the HWCVD metal filaments to enable thin film deposition at low process temperature range and combine the excited process gases with the rest of the source compounds or process gases right before all of the process gases and are delivered into a substrate processing zone and distributed uniformly above the surface of a substrate to ensure that the deposition reaction occurs uniformly across the surface of the substrate. Embodiments of the present invention may be utilized in the fabrication of thin film device fabrication, such as semiconductor devices, solar cells, thin film batteries, polymer devices, flexible photovoltaic devices, and flexible electronics and may have one or more of the following benefits: low deposition temperature, no need for plasma, more efficient, lower cost, high throughput, and more readily scalable.

FIG. 1 is a cross-sectional side view of one example of a process chamber 100 having a hot wire metal filament source and a showerhead design with partitioned gas delivery mechanisms for processing a substrate. The process chamber 100 generally includes a chamber body 102 which is coupled to a substrate support assembly 140, and a chamber lid 104 which is coupled to a showerhead assembly 120 and a metal filament assembly 130 to perform a HWCVD process on a substrate 106 disposed on the substrate support assembly 140. In one embodiment, the process chamber 100 is a HWCVD process chamber. In some embodiments, the chamber lid 104, or ceiling, of the process chamber 100 may be coupled to the chamber body 102 along a flange 158 that supports the chamber lid 104 and provides a surface to secure the chamber lid 104 to the chamber body 102.

Figure 2:
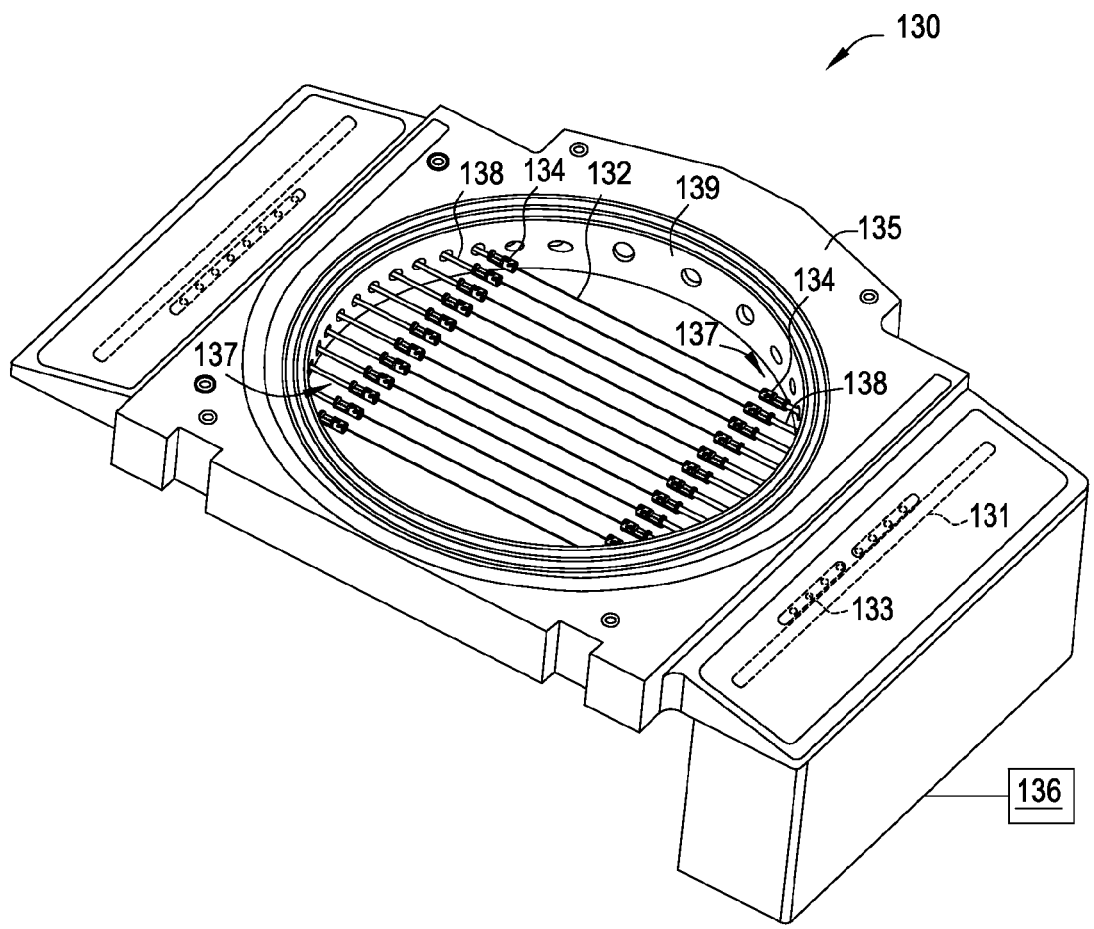
FIG. 2 is a schematic plan view of a metal filament assembly in accordance with some embodiments of the present invention.

FIG. 2 is a partial schematic top view of one example of the metal filament assembly 130. As shown in FIGS. 1 and 2, the metal filament assembly 130 of the process chamber 100 generally comprises a HWCVD source and includes one or more wire or metal filaments 132 supported by a filament adapter 135. The one or more metal filaments 132 may also be a single wire routed back and forth by the filament adapter 135 across an internal volume within the metal filament assembly 130.

Each metal filament 132 is comprised of any suitable conductive material, for example, tungsten, tantalum, iridium, or the like. The metal filament 132 may be formed into any thickness suitable to provide a desired temperature to facilitate substrate processing inside the process chamber 100. For example, in some embodiments, each metal filament 132 may comprise a diameter of about 0.1 mm to about 3 mm, or in some embodiments, about 0.5 mm, at a length suitable to cover the length or diameter of the substrate 106.

The filament adapter 135 is coupled to a power supply 136 to provide current to heat the metal filaments 132 connected thereto. The filament adapter 135 may act as a support structure for the metal filaments 132. In addition, the filament adapter 135 is coupled to the chamber body 102 of the process chamber 100 and may include one or more pieces connected together to form a singular structure surrounding the metal filaments 132 or may be provided as a plurality of support structures for the metal filaments 132. In one configuration, some or all of the components of the filament adapter 135 is mounted directly in or on the chamber body 102. Alternatively or in combination, the filament adapter 135 may be mounted in or on some other components of the process chamber 100. Each metal filament 132 is connected to the filament adapter 135 via two terminal connectors 137 (or wire holders) configured to hold the metal filament 132 at its two ends. Each terminal connector 137 or wire holder is provided to support the metal filament 132 in a desired position and configuration within the process chamber 100 and to keep each metal filament 132 taut within the filament adapter 135 while it is heated to high temperature. As such, the metal filaments 132 are protected inside the terminal connectors 137 to be electrically connected to one or more (+) power bus bars 131 and (−) power bus bars 133 within the filament adapter 135. The power bus bars 131, 133 in turn are connected to the power supply 136 to provide an electric current to each metal filament 132 within the process chamber 100 during substrate processing.

The terminal connector 137 may be a tensioning or a non-tensioning connector. Each terminal connector 137 may include a reflector shield 138 and a clamp 134. The clamp 134 is configured to secure the metal filament 132 in place and to provide electrical contact to the metal filament 132 to facilitate heating the metal filament 132.

The reflector shield 138 is provided to surround and shield the metal filament 132 within the terminal connector 137, as each metal filament 132 may expand as they are heated inside the process chamber 100. Each reflector shield 138 may include an inner wall defining a cylindrical opening to cover the metal filament 132 therein. The inner wall of the reflector shield 138 may be polished to reflect heat radiating from the metal filament 132 and back towards the metal filament 132. The diameter of the cylindrical opening may be about 2 to about 5 times the diameter of the metal filament 132. The length of the reflector shield 138 from the clamp 134 to the terminal ends of the metal filament 132 connected to the power bus bars 131, 133 may vary and may be, for example, about 5 mm to about 50 mm, depending on the wire diameter and the wire temperature during use. In some embodiments, the reflector shield 138 may be a tube. The reflector shield 138 may extend from the clamp 134. Alternatively, the reflector shield 138 may be part of the clamp 134.

In addition, a liner 139 may be used to surround the filament adapter 135 to minimize unwanted deposition or contamination on interior surfaces (e.g., the surfaces facing the metal filaments 132) of the filament adapter 135. Alternatively or in combination, one or more chamber liners or shields can be used to cover the interior surfaces of the chamber body 102 inside the process chamber 100. The liner 139, chamber liner or shield may be provided to prevent unwanted deposition and undesirable collection of deposited materials due to source compounds or process gases flowing inside the process chamber 100, and make cleaning the chamber components easier. In addition, the use of the liner, shields, and chamber liners may preclude or reduce the use of undesirable cleaning gases, such as the greenhouse gas $NF_3$. The liner 139, shields, and chamber liners may be removable, replaceable, and/or cleanable and may be fabricated from aluminum (Al) with roughened surfaces to enhance adhesion of deposited materials (to prevent flaking off of deposited material). In some embodiments, the metal filament assembly 130, the liner 139, any shields, and chamber liners may be removed for maintenance and cleaning by opening an upper portion of the process chamber 100.

Referring back to FIG. 1, a substrate 106 may be delivered (e.g., by a transfer robot) in and out of the process chamber 100 (e.g., in a horizontal direction as shown in an "IN" arrow in FIG. 1) to be disposed on the substrate support surface of the substrate support 108 via an opening 109 near a side of the chamber body 102. The opening 109 is coupled to a slit valve for sealing the process chamber 100 and processing the substrate 106 therein in a desired processing pressure. For example, the process chamber may be maintained at a pressure of about 10 Torr or lower during substrate processing. The substrate 106 may be circular or rectangular in shape and have a major side with a surface area available for deposition of about 700 centimeters$^2$ to about 1 meter$^2$ or greater, for example about 2 meters$^2$ to about 5.7 meters$^2$, or greater. The substrate 106 may be a silicon substrate, a glass substrate, a polymer substrate, a metal substrate, or other suitable substrate.

The substrate support assembly 140 includes a susceptor or substrate support 108 having a substrate support surface facing a substrate facing side of the showerhead assembly 120. The substrate support 108 is coupled to an actuator adapted to move the substrate support 108 linearly (e.g., vertically up and down) and/or rotationally relative to the showerhead assembly 120. For example, the substrate support 108 may be configured to be vertically movable (e.g., in the up and down direction "S" as shown in FIG. 1) to support the substrate 106 thereon in a substrate transfer position (e.g., a position that is vertically lowered than the vertical position of the opening 109) and/or a substrate processing position (e.g., a position that is often vertically higher than the substrate transfer position. In one example, the substrate support 108 may be horizontally stationary under the metal filament assembly 130 for static HWCVD deposition. As another example, the substrate support 108 may be horizontally movable for dynamic HWCVD deposition by passing the substrate 106 under the HWCVD source, such as, the metal filament assembly 130.

The substrate support 108 generally includes a heating element (not shown), such as a lamp or resistive heating element, to heat the substrate 106 to a desired temperature during substrate processing. The substrate support 108 may also be coupled to a power supply, such as a direct current (DC) power supply (not shown) to provide electrostatic chucking of the substrate 106. In addition, the chamber body 102 is coupled to one or more exhaust channels which at least partially surround the substrate support 108. Exhaust channels may be coupled to a vacuum pump to provide exhaust and/or negative processing pressure within the volume contained in the chamber body 102.

In the example of FIG. 1, a substrate processing zone 180 is formed between the substrate facing side of the showerhead assembly 120 and the substrate 106 disposed on the substrate support 108 (e.g., in its substrate processing position). The embodiments described herein enable the delivery of two or more distinct fluids, such as process fluids, process gases, source compounds, precursor compounds, carrier gases, inert gases, among others, without mixing the fluids or compounds until reaching the substrate processing zone 180 near or directly above the surface of the substrate 106. For example, mixing of process gases and precursor compounds may be controlled such that reactions take place mainly in the substrate processing zone 180. Unwanted deposition on chamber components and particle generation may be minimized. This increases throughput by the reduction of particles and minimizing downtime for chamber cleaning.

In depositing a thin film on the surface of the substrate 106 from a mixture of two or more source compounds, process gases, fluids, carrier gases, it is contemplated to separate the flow of the two or more source compounds. Exemplary thin film processing reactions that may use two or more process fluids, source compounds, and precursor compounds include thin film deposition reactions, etch reactions, substrate cleaning reactions, chamber cleaning reactions, among others.

It is configured that only a portion of a reaction mixture for thin film processing is passed through a HWCVD filament assembly to be excited to form radicals. For example, in a substrate processing reaction of two or more source compounds, a first source compound is delivered to pass through a hot wire metal filament source, such as the metal filament assembly 130, such that the first source compound is excited to form radicals or excited species. A second source compound is prevented from forming into radicals, from reacting with the radicals of the first source compound, from reacting with the metal filaments 132, or any other chamber components until the second source compound and the radicals of the first source compound reach the substrate processing zone 180 near the surface of the substrate 106 to ensure complete reactions of the two source compounds and prevent the formation of contaminations on chamber components. In one example, the first source compound may include, is not limited to, a nitrogen-containing compound, a hydrogen-containing compound, ammonium, among others. The second source compound may include, is not limited to, a silicon-containing source compound, silane, disilane, among others, for forming a silicon-based thin film on the surface of a substrate.

As shown in FIG. 1, the first source compound may be delivered into the process chamber 100 from a first fluid source 118 via a first source inlet line 116 to pass through the metal filament assembly 130 and the showerhead assembly 120 prior to reaching the substrate processing zone 180. In addition, the process chamber 100 may be coupled to a second fluid source 128 via a second source inlet line 127 for delivering the second source compound into the showerhead assembly 120 inside the process chamber without passing through the metal filament assembly 130 prior to reaching the substrate processing zone 180. Additional fluid sources, source inlets, fluid lines, for delivering additional process gases, precursor compounds, carrier gases, fluids or gases may be coupled to the components of the process chamber 100 without departing from the scopes of the invention as described herein.

Further, the process chamber may include additional components to ensure the flowing and delivery of the various source compounds uniformly and evenly across the surface of the substrate 106 within the substrate processing zone 180. In one example, the process chamber may include a perforated plate, such as a blocker plate 160 with a plurality of through-holes 162. The blocker plate 160 is coupled to the chamber lid 104 and disposed between the first source inlet line 116 and the metal filament assembly 130 to ensure even dispersion of source compounds and process gases from the first source inlet line 116 into the metal filament assembly 130.

In another example, the process chamber 100 may further include a second showerhead assembly, such as a showerhead assembly 110, disposed between the first source inlet line 116 and the metal filament assembly 130. In one configuration, the process chamber 100 may include both the blocker plate 160 and the showerhead assembly 110, where the showerhead assembly 110 is disposed between the blocker plate 160 and the metal filament assembly 130. The blocker plate 160 and the showerhead assembly 110 may be fabricated from or contains a material that is adapted to withstand the elevated temperatures of the metal filaments 132 after a current is applied to the metal filaments 132. For example, the blocker plate 160 may contain a nickel containing material with a relatively high melting point.

The showerhead assembly 110 may be coupled to the chamber lid 104, e.g., via the flange 158 as shown in FIG. 1 and may generally include a face plate 115 and/or a showerhead body surrounding the face plate 115. The face plate 115 of the showerhead assembly 110 may be a dual-zone face plate with two or more types of channels therein or a single zone face plate with one type of channels (e.g., through-holes) therein, and is configured to deliver the first source compound through its channels for even distribution of the first source compound through the metal filament assembly 130.

Figure 3A:
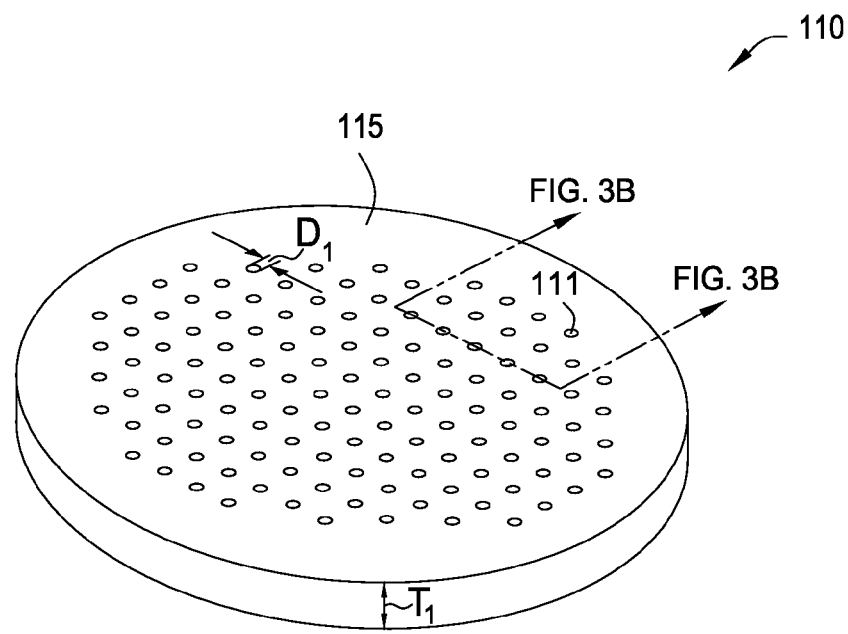
FIG. 3A is a plan view of a showerhead assembly having a single-zone face plate in accordance with some embodiments of the present invention.
Figure 3B:
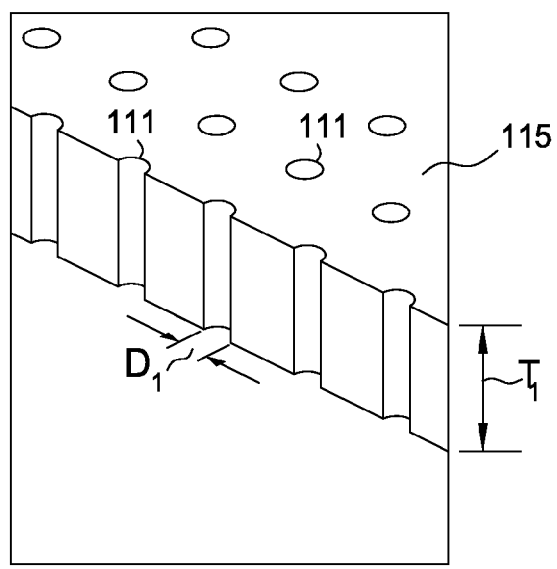
FIG. 3B is a schematic cross-sectional view of the example of the face plate as shown in FIG. 2A.

FIG. 3A is a plan view of one example of a single-zone face plate of the showerhead assembly 110. FIG. 3B is a schematic cross-sectional view of the example of the single-zone face plate, such as the face plate 115 as shown in FIG. 3A. The face plate 115 generally includes a plurality of through holes, such as one or more channels 111, having a diameter "$D_1$" and a thickness "$T_1$".

Referring back to FIG. 1, the showerhead assembly 120 disposed between the metal filament assembly 130 and the substrate support assembly 140 is comprised of a dual-zone face plate and a showerhead body surrounding the dual-zone face plate. In general, a dual-zone face plate includes a face plate with two or more types of channels formed into its inner portion and a showerhead body surrounding the face plate. For example, the showerhead assembly 120 inside the process chamber 100 generally includes a showerhead body 129 and a dual-zone face plate, such as a face plate 125.

The face plate 125 may include two or more types of channels, such as a plurality of first channels 121 and a plurality of second channels 122 therein. In the example of the process chamber 100, the face plate 125 may be formed by welding a top plate and a bottom plate together with a plenum 124 therebetween. Other method of forming the face plate can also be used. In one aspect, the first channels 121 (or through-holes) are formed to pass through the top plate, the plenum 124, and the bottom plate without contacting the second channels 122 and/or the plenum 124 between the top plate and the bottom plate. The second channels 122 are formed from the plenum 124 through the bottom plate.

The showerhead body 129 may include a conduit 126 therein. As shown in FIG. 1, the second source inlet line 127 for delivering the second source compound into the showerhead assembly 120 of the process chamber 100 is coupled to the conduit 126 disposed within the showerhead body 129 of the showerhead assembly 120. In one example, the conduit 126 may extend across a portion of the showerhead body 129 surrounding a peripheral portion of the face plate 125 and is connected to the second channels 122 of the face plate 125 (e.g., via the plenum 124).

Figure 4A:
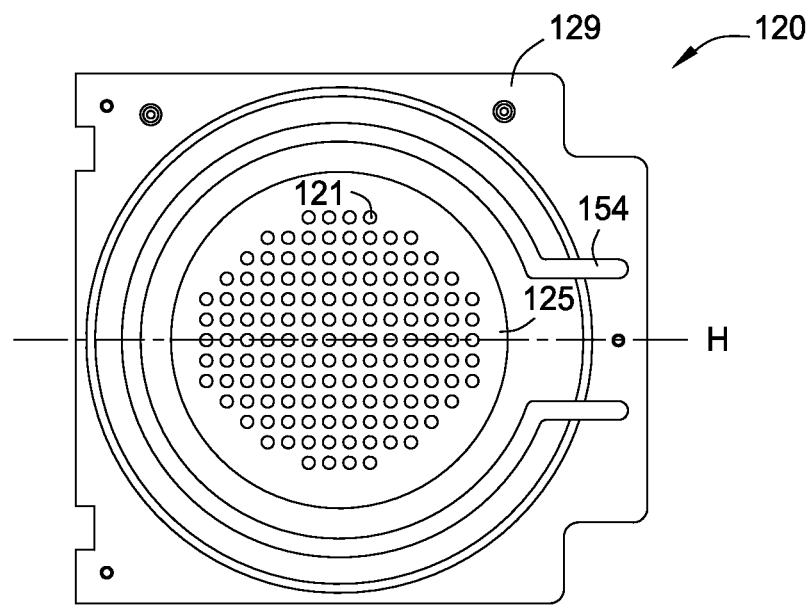
FIG. 4A is a showerhead assembly having a dual-zone face plate in accordance with some embodiments of the present invention.
Figure 4B:
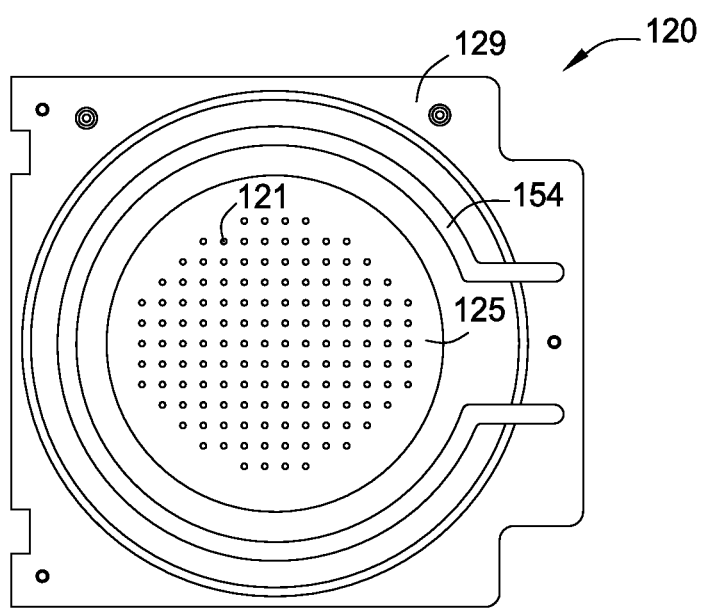
FIG. 4B is a showerhead assembly having another dual-zone face plate in accordance with some embodiments of the present invention.

FIGS. 4A-4B illustrates two examples of a showerhead assembly having a dual-zone face plate. As shown in FIGS. 4A and 4B, when viewed from a side of the top plate of the face plate 125 facing the metal filament assembly 130, such as an upper surface of the face plate 125, only the first channels 121 are disposed. FIGS. 4A and 4B illustratively show that the diameters of the first channels 121 can vary, thus providing a way to control the speed of the flow of the first source compound passing through the first channels 121. In one embodiment, the diameters of the first channels 121 are larger than the diameters of the second channels 122.

In addition, the showerhead assembly 120 may also include one or more cooling channels, such as cooling channel 154, which is disposed within the showerhead body 129, as shown in FIG. 4A, or within the face plate. The cooling channel 154 is configured to surround the channels (e.g., the first channels 121 and the second channels 122) and control the temperature of the source compounds flown therein. Further, the showerhead assembly 120 may include one or more heating elements or heating channels, disposed in the showerhead body 129 or the face plate 125 to surround the channels (e.g., the first channels 121 and the second channels 122) and configured to control the temperature of the source compounds flown therein.

Further, as shown in FIG. 1, the heating elements or heating channels, such as the heating channel 152, may be disposed within the metal filament assembly 130. The thermal control aspects provided herein also enable temperature control of the various process fluids or gases provided to the substrate processing zone 180. This provides enhanced control of processes within the process chamber 100, such as deposition processes, etch processes, and the like. In one embodiment, substrate processing within the substrate processing zone 180 of the process chamber 100 is controlled at a temperature of 70° C. or higher, which is much lower than a temperature of about 700° C. or higher of a convention thermal CVD process.

Figure 4C:
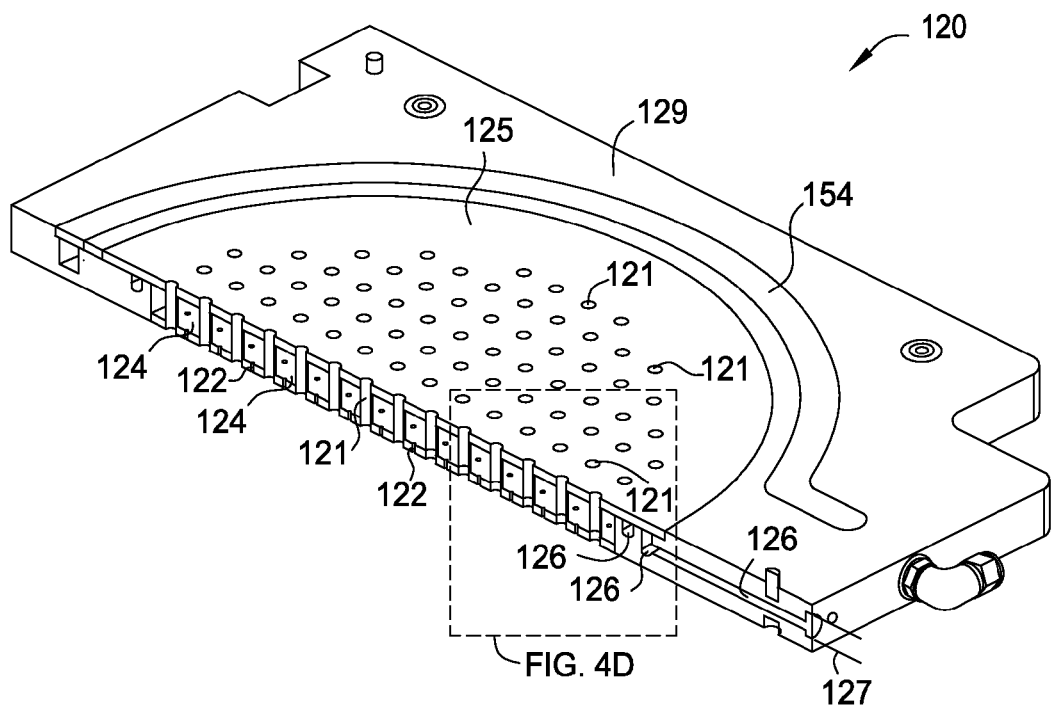
FIG. 4C is a schematic view of a dual-zone face plate of a showerhead assembly in accordance with some embodiments of the present invention.
Figure 4D:
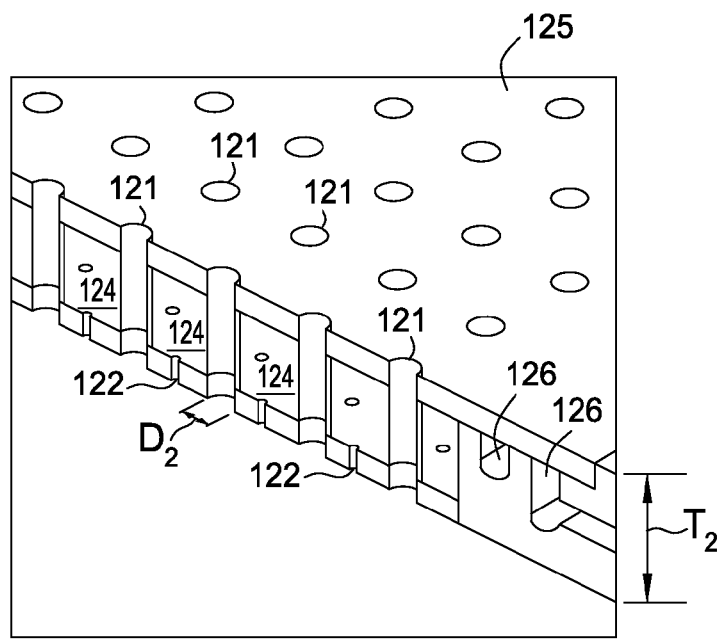
FIG. 4D is a detailed view of the example of the dual-zone face plate as shown in FIG. 4C.

FIG. 4C is a schematic cross-sectional view of the example of the dual-zone face plate of FIG. 4A, cutting across a dotted line "H". FIG. 4D is a detailed view of a portion of the dual-zone face plate as shown in FIG. 4C. In FIG. 4C, the first source compound flowing through the metal filament assembly 130 is delivered to pass through the first channels 121 formed through the face plate 125 of the showerhead assembly 120, whereas the second source compound is delivered from the second source inlet line 127, through the conduit 126 within the showerhead body 129 and surrounding the face plate 125. In addition, the second source compound flowing inside the conduit 126 is further delivered into the plenum 124 within the face plate 125 to pass through the face plate 125 via the second channels 122, which is disposed on one side of face plate 125 of the showerhead assembly 120; for example, on a bottom surface side of the bottom plate or the side facing the substrate support assembly 140 and/or the substrate processing zone 180.

In one embodiment, the face plate 125 generally has a thickness "$T_2$", where each first channel 121 has the same thickness "$T_2$". In addition, each first channel 121 has a diameter "$D_2$", which is larger than the diameter of the second channels 122. The differences in the channel diameters can assist process reactions within the substrate processing zone such that there are more excited radicals of the first source compound passing through the first channels 121 to be react with the second source compound delivered from the second channels 122. In another embodiment, the diameters of the first channels 121 can be equal to or smaller than the diameters of the second channels 122 to allow for optimized reaction of the first and second source compounds and various process gases delivered through the first and second channels.

In another embodiment, each first channel 121 is disposed between two or more second channels 122. For example, in FIGS. 4C and 4D, each first channels 121 is surrounds by 4 second channels 122. It is contemplated that the position and distribution of the first channels 121 and second channels 122 within the face plate 125 are configured to enhance the chance of reacting the radicals of the first source compound with the second source compound occurring on the lower surface of the face plate 125 of the showerhead assembly 120 facing the substrate processing zone 180 and the substrate support assembly 140, evenly and uniformly within the substrate processing zone 180.

Figure 4E:
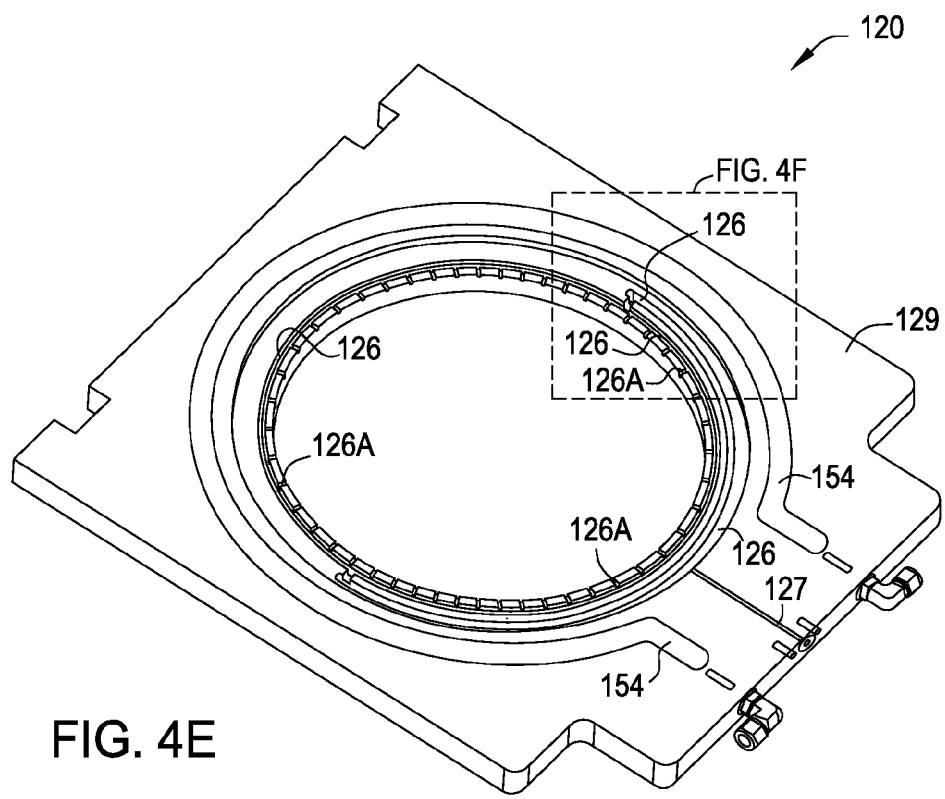
FIG. 4E is a schematic view of a showerhead body of a showerhead assembly in accordance with some embodiments of the present invention.
Figure 4F:
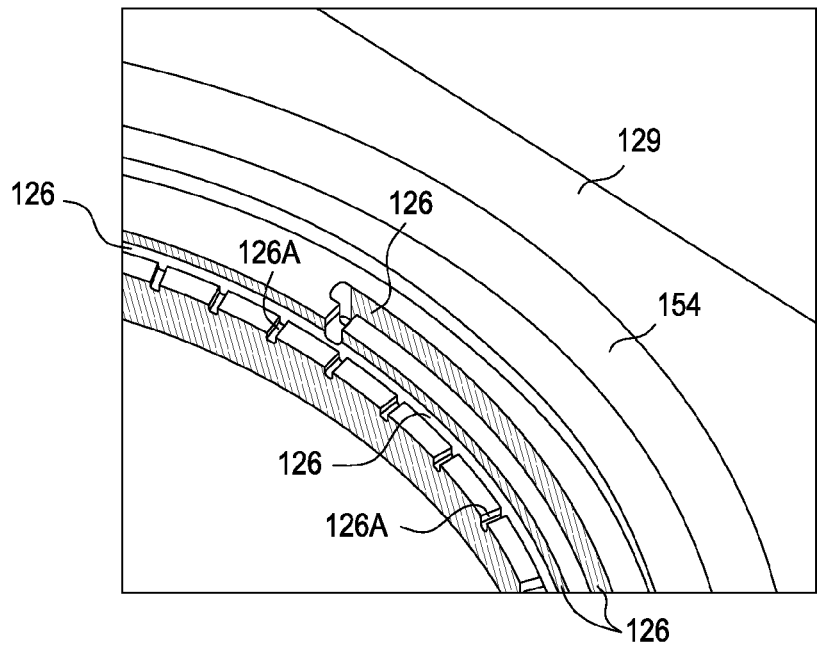
FIG. 4F is a detailed view of the example of the showerhead body as shown in FIG. 4E.

FIG. 4E is one example of a showerhead body of a showerhead assembly, such as the showerhead body 129, and FIG. 4F is a detailed view of the example of the showerhead body 129 as shown in FIG. 4E. As shown in FIG. 4E, the second source compound delivered from the second source inlet line 127 is flown inside the conduit 126 within the showerhead body 129 to pass into the plenum 124 and the second channels 122 of the face plate 125. In one example, the conduit 126 includes one or more grooved conduits extending through a portion of the showerhead body 129, e.g., the inner portion, surrounding the peripheral portion of the face plate 125 in one or more rounds. For example, in FIG. 4E, the conduit 126 extends radial inward in one and half circular round.

In one configuration, the conduit 126 may be formed into a plurality of channels or grooved conduits 126A which are connected to the plenum 124 of the face plate 125. The plurality of the grooved conduits 126A may be evenly disposed within an inner circumferential portion of the showerhead body 129 to surround the peripheral portion of the face plate 125 and direct the flow of the second source compound delivered inside the conduit 126 to pass through the grooved conduits 126A and ensure multiple flows and even distribution inside and throughout the plenum 124 of the face plate 125, which in turn leading to even distribution of the second source compound in all of the plurality of the second channels 122.

Accordingly, the second channels 122 are formed through the lower surface of the dual-zone face plate facing the substrate processing zone 180 and the second source compound is delivered from the conduit 126 and the plurality of the grooved conduits 126A of the showerhead body 129 to pass through the plenum 124 and the second channels 122 of the face plate 125 into the substrate processing zone 180 without delivering the second source compound through the metal filament assembly 130 or forming any plasma.

Referring back to FIG. 1, only a portion of reaction source compounds, process gases and carrier gases, such the flow of the first source compound, is delivered through the metal filament assembly 130 and excited to form into radicals. The formed radicals of the first source compound are directed to pass though the plurality of the first channels 121 to arrive at the substrate processing zone 180 and react with the rest of the reaction source compounds on the surface of the substrate 106. To ensure complete excitation of all of the first source compound flowing through the metal filaments 132 of the metal filament assembly 130 and even distribution of the excited species through the first channels 121 of the showerhead assembly 120, it is contemplated that the positions of the metal filaments 132 and the positions of the first channels 121 inside the process chamber 100 can be adjusted and aligned in an optimized arrangement.

In one configuration, the amount of the excited species of the first source compound entering in to the substrate processing zone 180 can be controlled by the amount and flow of the first source compound delivered from the first fluid source 118 along the flow path of the first source compound within the process chamber 100, including the thickness and the arrangement and distribution of the through-holes 162 of the blocker plate 160, thickness "$T_1$" and the arrangement and distribution of the channels 111 of the showerhead assembly 110, the thickness and the number of the metal filaments 132 disposed therein, the thickness "$T_2$" and the arrangement and distribution of the first channels 121 of the showerhead assembly 120, as well as the alignment of the metal filaments 132 with the distribution of the first channels 121.

Figure 5A:
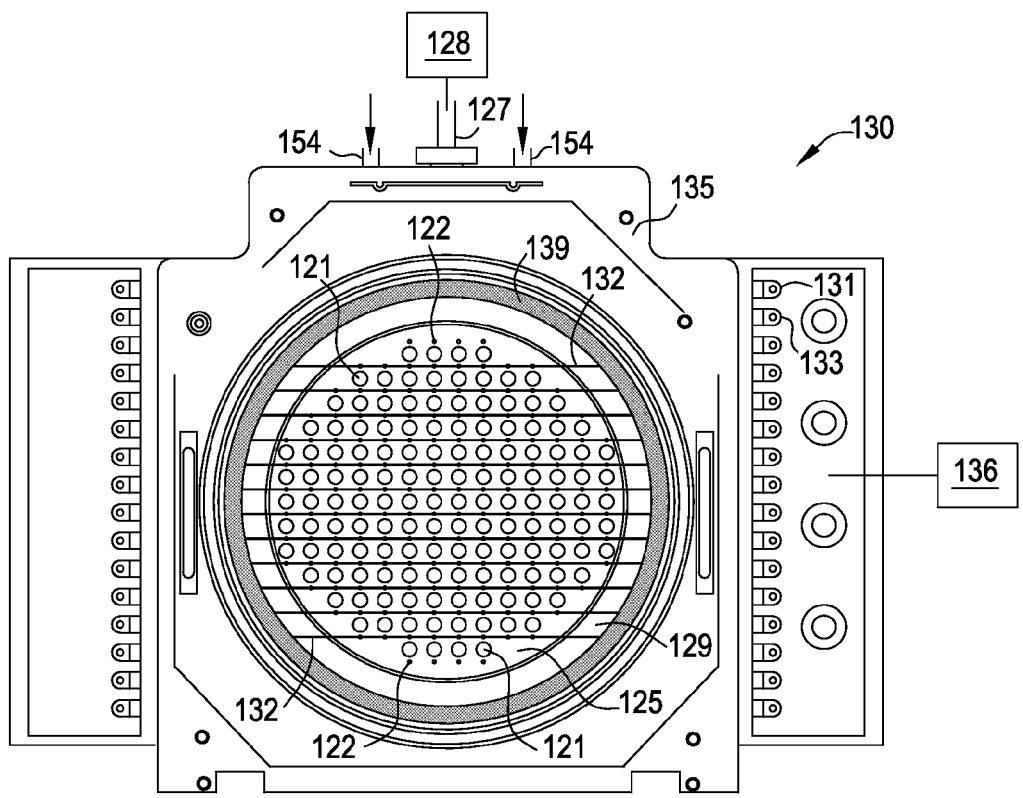
FIG. 5A is a top view of a metal filament assembly aligned on top of a showerhead assembly having a dual zone face plate in accordance with some embodiments of the present invention.
Figure 5B:
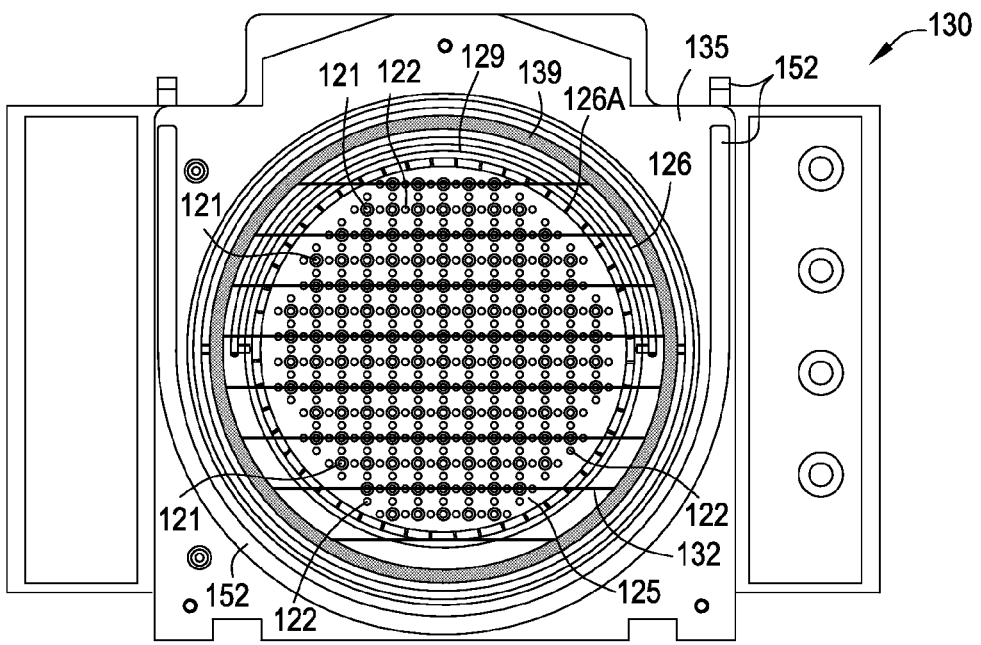
FIG. 5B is a top view of another metal filament assembly aligned on top of a showerhead assembly having a dual zone face plate in accordance with some embodiments of the present invention.

FIGS. 5A and 5B illustrate two examples of controlling the alignment of a metal filament assembly on top of a showerhead assembly having a dual zone face plate in a HWCVD as viewed from the metal filament assembly. As stated, the number of the metal filaments 132 used and their positions disposed within the process chamber 100 can be adjusted such that the metal filaments 132 may be disposed to be aligned with or not to be aligned with the first channels.

In the example of FIG. 5A, each wire of the metal filaments 132 is not aligned with the holes of the first channels 121 disposed on the upper surface of the face plate 125 to ensure complete excitation of the first source compound by the metal filaments prior to passing through the first channels 121 and entering into the substrate processing zone 180. For example, each metal filament 132 may be disposed and aligned to each row of the second channels 122.

As another example, for a different deposition process using different source process gases, each wire of the metal filaments 132 may be configured to be aligned with the holes of the first channels 121 in order to obtain faster flow and delivery of the radicals of the first source compound through the first channels 121, in a shorter path, prior to entering into the substrate processing zone 180. In one example, as shown in FIG. 5B, each wire of the metal filaments 132 may be configured to be aligned with the holes of the first channels 121 in every other row of the first channels in order to balance faster flow and delivery of the radicals of the first source compound through the first channels 121 and complete excitation of the first source compound.

The flow description of the source compound described herein is directed towards a broad dual-zone face plate description and should not be interpreted or construed as limiting the showerhead aspects described herein. While the following description is described with the deposition of dielectric materials, the inventors contemplate that this apparatus and methods may be used to deposit metal and other materials. It is believed that a dual zone gas showerhead as described herein allows separate process gas introduction into the process chamber and formation of radicals using the metal filaments to avoid any undesirable gas reactions and mixing prior to entering the substrate process zone. The dual-zone showerhead provides better uniform gas distribution through independent gas introduction and control at center and at edge of the showerhead. Examples of a process chamber 100 that may be utilized include the PRODUCER® chemical vapor deposition (CVD) system as well as other CVD systems, including AKT® CVD systems, all of which are available from Applied Materials, Inc., of Santa Clara, Calif.

Figure 6:
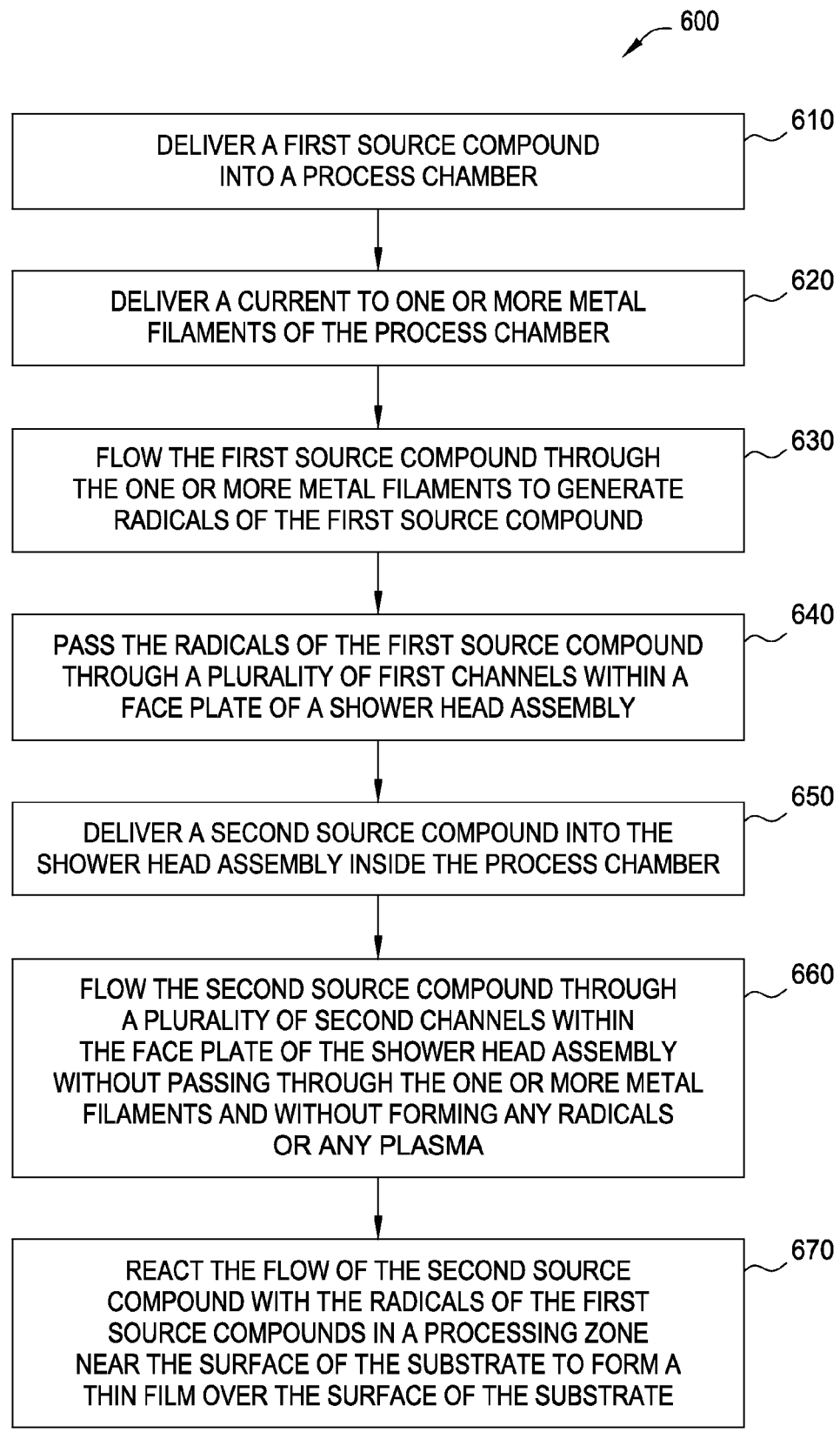
FIG. 6 is a method of processing a substrate using the process chamber as described herein in accordance with some embodiments of the present invention.

FIG. 6 is one example of a method 600 of processing a substrate using the process chamber as described herein according to one embodiment of the invention. At 610, a first source compound is delivered into the process chamber. For example, the first source compound may be delivered from the first fluid source 118 via the first source inlet line 116 to enter into the metal filament assembly 130 and be excited into radicals inside process chamber 100. In a process of depositing a silicon-containing thin film, wherein the first source compound to be delivered through a HWCVD metal filament assembly may include nitrogen gas, hydrogen gas, noble gas, and combinations thereof.

The method 600 may further include delivering the first source compound through a showerhead assembly prior to flowing the first source compound through the one or more metal filaments of the metal filament assembly of the HWCVD process chamber. The showerhead assembly may include a single-zone face plate, a dual-zone face plate, or other types of face plates.

At 620, an electric current is delivered to one or more metal filaments of the metal filament assembly inside the process chamber. At 630, the first source compound is flown through the one or more metal filaments to generate radicals of the first source compound within the HWCVD process chamber.

At 640, the radicals of the first source compound are passed through a showerhead assembly disposed between the metal filament assembly and a substrate processing zone to obtain even distribution of the radicals of excited first source compound within the substrate processing zone, leading to uniform distribution of the radicals across the surface of the substrate. The showerhead assembly generally includes two or more types of channels within its face plate and, the radicals of the first source compound may be delivered through a plurality of first channels within the face plate of the showerhead assembly.

At 650, a second source compound is delivered into the showerhead assembly inside the process chamber without passing through the metal filament assembly. For example, the second source compound may be delivered through a plurality of second channels within the face plate of the showerhead assembly. In one example, in a process of depositing a silicon-containing thin film, wherein the second source compound is prevented from passing through a HWCVD metal filament assembly, the second source compound may include, silane, disilane, and combinations thereof.

Accordingly, at 660, the second source compound is delivered through a plurality of second channels within the face plate of the showerhead assembly without forming any radicals or any plasma and without contacting the radicals of the first source compound. Next, at 670, the flow of the second source compound delivered through the second channels is mixed with and reacted with the radicals of the first source compound delivered through the first channels in a substrate processing zone near the surface of the substrate. Then, a thin film is formed over the surface of the substrate from the mixture of the second source compound and the radicals of the first source compound. With the use of the HWCVD source inside the process chamber, the temperature inside the process chamber can be controlled at a low temperature range, such as between about 50° C. and about 500° C., even without the use of plasma. Such a low deposition temperature is much lower than a convention thermal CVD process, which generally requires 1000° C. or higher.

Accordingly, with the separation of the process gases inside the showerhead designs of the HWCVD chamber, many of the problems as seen in prior designs are solved. For example, break down, decomposition, or otherwise reaction of a process gas mixture prior to reaching the processing zone is reduced. Contamination of the process gases within a gas mixing device, deposition on or etching of the gas mixing device, conduits, channels, showerhead, and other chamber components or inside the holes and channels of the face plate of the gas distribution assembly are avoided. Additionally, reaction by-products, unwanted particles, film impurities, and contaminants are greatly reduced. Most importantly, the HWCVD deposition chamber described herein greatly improve the quality of the thin film and film uniformity deposited on the surface of the substrate.

While the foregoing is directed to embodiments of the present invention, other and further embodiments of the invention may be devised without departing from the basic scope thereof.

What is claimed is:

1. A process chamber for processing a substrate, comprising:
   a substrate support assembly positioned below a substrate processing zone to support a substrate thereon;
   a chamber lid positioned opposite the substrate support assembly above the substrate processing zone, the chamber lid having a first source inlet configured to deliver a first source compound to the substrate processing zone;
   a metal filament assembly coupled to the chamber lid and disposed between the substrate support assembly and the first source inlet, the metal filament assembly comprising:
      a filament adapter having an internal volume and supporting one or more metal filaments within the internal volume; and
      a heating channel disposed within the metal filament assembly proximate the internal volume; and
   a showerhead assembly disposed between the metal filament assembly and the substrate support assembly, the showerhead assembly comprising:
      a dual-zone face plate, having a plurality of first channels and second channels; wherein the first source compound is delivered from the first source inlet to pass through the metal filament assembly and the first channels and form radicals of the first source compound in the substrate processing zone without forming any plasma; and
      a showerhead body comprising a fluid conduit that surrounds the dual-zone face plate, to flow a second source compound therein, and to deliver the second source compound from the showerhead body into the dual-zone face plate, wherein the second source compound can pass through the second channels of the dual-zone face plate without contacting the first channels and without forming any radicals or plasma, and is delivered into the substrate processing zone to react with the radicals of the first source compound on a surface of the substrate.

2. The process chamber of claim 1, further comprising:
a blocker plate disposed between the metal filament assembly and the first source inlet.

3. The process chamber of claim 2, further comprising:
a second showerhead assembly disposed between the metal filament assembly and the first source inlet.

4. The process chamber of claim 1, further comprising:
a second showerhead assembly disposed between the metal filament assembly and the first source inlet.

5. The process chamber of claim 4, wherein the second showerhead assembly comprises a face plate selected from the group consisting of a single-zone face plate, a dual-zone face plate, and combinations thereof.

6. The process chamber of claim 1, wherein the metal filament assembly is connected to a power supply to deliver an electrical current through the one or more metal filaments and form the radicals of the first source compound inside the process chamber.

7. The process chamber of claim 1, wherein the first channels are formed through an upper surface and a lower surface of the dual-zone face plate to deliver the first source compound in fluids, gases and/or radicals into the substrate processing zone.

8. The process chamber of claim 7, wherein the second channels are formed on the lower surface of the dual-zone face plate facing the substrate processing zone and are connected to the fluid conduit of the showerhead body to deliver the second source compound into the substrate processing zone without passing the second source compound through the metal filament assembly or forming any plasma.

9. The process chamber of claim 1, wherein diameters of the first channels are larger than diameters of the second channels.

10. The process chamber of claim 1, wherein each first channel is disposed between two or more second channels on a lower surface of the dual-zone face plate of the showerhead assembly and configured to enhance the chance of reacting the radicals of the first source compound with the second source compound.

11. The process chamber of claim 1, wherein the fluid conduit of the showerhead body is connected to a second source inlet to deliver the second source compound into the process chamber.

12. The process chamber of claim 1, wherein the showerhead assembly further comprises at least one of:
one or more cooling channels; or
one or more heating elements or heating channels.

13. The process chamber of claim 1, wherein the dual-zone face plate of the showerhead assembly is formed by welding a top plate and a bottom plate together with a plenum therebetween, and wherein the plenum is connected to the fluid conduit and the second channels for delivering the second source compound.

14. The process chamber of claim 13, wherein the first channels are formed to pass through the top plate, the plenum, and the bottom plate without contacting the second channels or the plenum between the top plate and the bottom plate, and wherein the second channels are formed from the plenum through the bottom plate.

15. A process chamber for processing a substrate, comprising:
a substrate support assembly to support the substrate thereon and positioned near a substrate processing zone;
a chamber lid positioned opposite the substrate support assembly above the substrate processing zone, the chamber lid having a first source inlet configured to deliver a first source compound to the substrate processing zone;
a metal filament assembly coupled to the chamber lid and disposed between the substrate support assembly and the first source inlet, the metal filament assembly comprising:
a filament adapter having an internal volume and supporting one or more metal filaments within the internal volume; and
a heating channel disposed within the metal filament assembly proximate the internal volume;
a first showerhead assembly, disposed between the first source inlet and the metal filament assembly and having a plurality of holes to permit flow of the first source compound therethrough; and
a second showerhead assembly positioned between the metal filament assembly and the substrate support assembly, the second showerhead assembly comprising:
a dual-zone face plate having a plurality of first channels and second channels; wherein the first source compound is delivered from the first source inlet to pass through the metal filament assembly and the first channels and form radicals of the first source compound in the substrate processing zone without forming any plasma; and
a showerhead body, which comprises a fluid conduit that is connected to a second source inlet to deliver a second source compound into the process chamber that surrounds the dual-zone face plate, to flow the second source compound therein, and to deliver the second source compound from the showerhead body into the dual-zone face plate, wherein the second source compound can pass through the second channels of the dual-zone face plate without contacting the first channels and without forming any radicals or plasma, and is delivered into the substrate processing zone to react with the radicals of the first source compound on a surface of the substrate.

16. The process chamber of claim 15, further comprising:
a blocker plate disposed between the first showerhead assembly and the first source inlet.

17. The process chamber of claim 1, wherein each of the one or more metal filaments further comprise:
two terminal connectors, wherein each terminal connector couples a respective end of the one or more metal filaments to the filament adapter and provides an electrical connection between the metal filament and the filament adapter.

18. The process chamber of claim 1, wherein the first channels are aligned with the one or more metal filaments.

19. The process chamber of claim 1, wherein the first channels are not aligned with the one or more metal filaments, and wherein the second channels are aligned with the one or more metal filaments.

20. The process chamber of claim 1, wherein the first channels are arranged in a plurality of parallel rows, wherein the one or more metal filaments are arranged in a plurality of parallel rows, and wherein the one or more metal filaments are aligned with the first channels only along every other row of the first channels.

* * * * *